United States Patent [19]

List et al.

[11] Patent Number: 4,862,417
[45] Date of Patent: Aug. 29, 1989

[54] REDUNDANT-STORAGE MEMORY

[75] Inventors: Frans J. List; Cathal G. Phelan, both of Eindhoven, Netherlands

[73] Assignee: U.S. Philips Corp., New York, N.Y.

[21] Appl. No.: 126,396

[22] Filed: Nov. 30, 1987

[30] Foreign Application Priority Data

May 5, 1987 [NL] Netherlands ............................ 8701085

[51] Int. Cl.$^4$ ........................... G11C 7/00; G11C 8/00
[52] U.S. Cl. ................................ 365/200; 365/230.06
[58] Field of Search ...................... 365/189, 200, 230; 371/10, 11; 307/445, 449

[56] References Cited

U.S. PATENT DOCUMENTS

| | | | |
|---|---|---|---|
| 4,598,388 | 7/1986 | Anderson | 365/200 |
| 4,720,817 | 1/1988 | Childers | 365/200 |
| 4,737,935 | 4/1988 | Wawersig et al. | 365/200 |
| 4,748,597 | 5/1988 | Saito et al. | 365/200 X |

*Primary Examiner*—Stuart N. Hecker
*Assistant Examiner*—Alyssa H. Bowler
*Attorney, Agent, or Firm*—Steven R. Biren

[57] ABSTRACT

A memory incorporates redundancy in the form of one or ore redundant columns. An applied binary address is first distributed between predecoders which form a 1-out-of-$2^n$ code from n bits received. For each non-redundant column there is available a part of a main decoder, each part receiving a different combination of the bits supplied by the predecoders, thus selecting the column. For each redundant column there is provided a redundancy decoder. The latter decoder receives all bits supplied by the predecoders, each time via a series connection of a activatable gating element and a fuse element. Per predecoder the outputs of the series connections are combined in a wired logic function. Each wired logic function forms an input signal of the actual redundancy decoder. When a redundant column is to be addressed, all fuse elements but one of a group are opened and the gating elements are activated. A memory column to be replaced is then uncoupled by way of another fuse element.

6 Claims, 4 Drawing Sheets

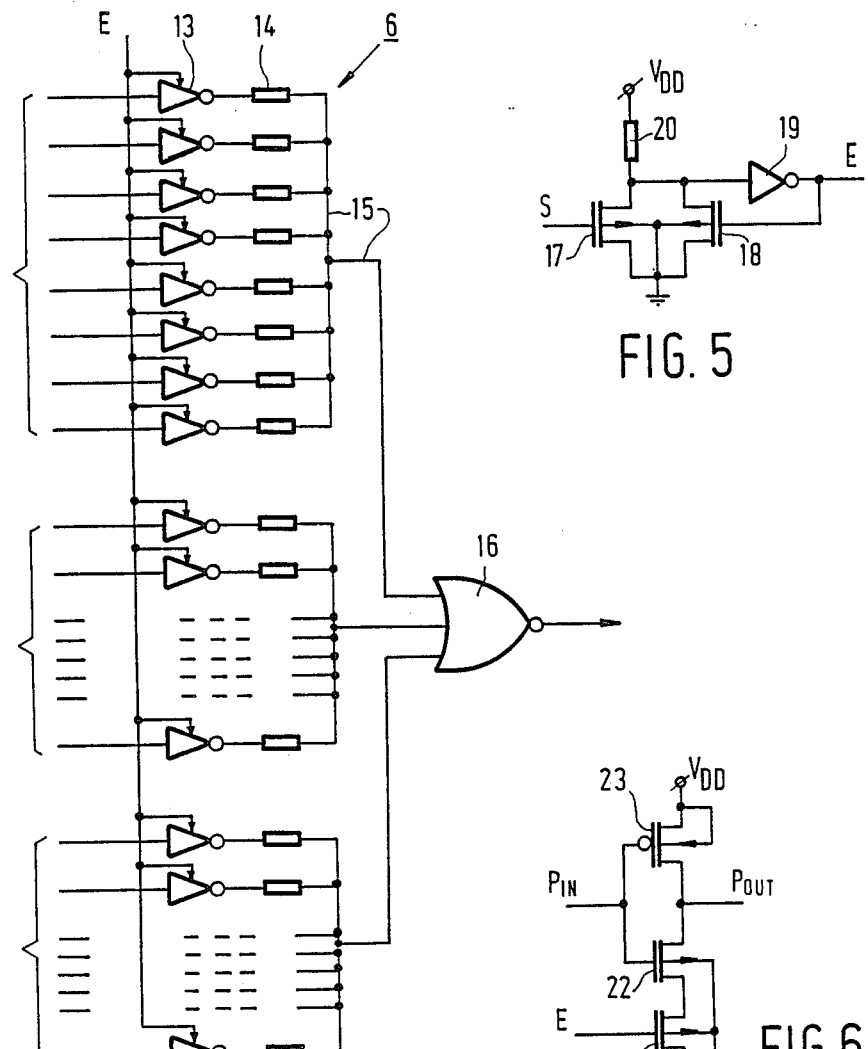

REDUNDANT-STORAGE MEMORY

BACKGROUND OF THE INVENTION

The invention relates to a memory having redundant storage space, which memory comprises address inputs via which address bits can be supplied, a plurality of predecoders, each of which outputs predecoded address bits, after the supply of a part of said address bits, and a main address decoder which is connected to the precoders and which comprises logic gate circuits, each of which comprises a number of inputs which corresponds at least to the number of precoders, a selection bit for controlling a memory column being derived in said logic gate circuits from the supplied predecoded address bits, the main address decoder comprising for each memory column a fuse element for uncoupling the relevant memory column in the case of a defect therein, which memory also comprises a redundancy address decoder which is fed by all outputs of the precoders via a corresponding number of fuse elements associated with the redundancy address decoders and which supplies, in the case of a defect in a memory column and after the uncoupling of the relevant fuse elements, a selection bit for a substitute redundant memory column.

Notably in large memories one or more redundant memory rows and/or columns are added in order to enable replacement of a relevant row or column by a redundant memory row or column in the case of a defect in the memory, so that the memory can be considered to have been repaired. Repair is realized, for example by the opening of fuse elements provided in the memory for this purpose, that is to say so that, when a defective memory row or column is addressed, the memory address presented is replaced by the address of a redundant memory row or column. The logic customarily used for this purpose consists of a circuit in which every memory address presented is compared with that of the defective row or column. When these two addresses correspond, the redundant row or column in the memory is activated.

The addition of redundant memory rows and/or column may give rise to problems in that the comparison of the addresses is too time consuming; the access time of a repaired memory may then deviate substantially from that of a correctly operating, non-repaired memory. When the memory is accommodated in a single chip, the surface area occupied thereby may be larger than could be expected on the basis of the added rows and/or columns in that the redundancy circuit is not very compatible with the architecture of the memory.

An important contribution to the elimination of these problems is made in European Patent Application No. 0 215 485 which corresponds to U.S. Pat. No. 4,748,597. In the memory described therein, no direct comparison is performed between a memory address presented and an address of a defective memory row or column which is programmed, for example by means of fuse elements. Said European Patent Application describes a memory which has a redundant storage space as described in the preamble and in which the redundancy address decoder comprises a logic gate circuit whose inputs receive the predecoded address bits via relevant fuse elements. The redundancy address decoder therein aims to minimize the number of fuse elements to be openened in the case of a defective row or column. However, this has resulted in a construction in which the gate depth of on the one hand the logic gate circuit in the redundancy address decoder and of the logic gate circuits in the main address decoder on the other hand differ substantially. For example, in FIG. 2 of said European Patent Application the redundancy address decoder comprises an 8-input gate circuit while the main address decoder comprises 2-input gate circuits, implying a comparatively large difference in gate depth. Consequently, the redundancy address decoder is too slow in comparison with the corresponding decoding channels in the main address decoder. This slow operation could lead to unacceptable results when a large memory is to be manufactured; due to the number of predecoded address bits which is much larger in that case, the gate depth of the redundancy address decoder will be greater accordingly.

SUMMARY OF THE INVENTION

It is the object of the invention to provide a memory having redundant storage space in which the gate depth of the redundancy address decoder is adapted to a high degree to that of the various decoding channels in the main address decoder.

To achieve this, the described memory having redundant storage space in accordance with the invention is characterized in that the redundancy address decoder comprises series connections which are all composed of a gating element and a fuse element which is connected in series therewith, all gating elements being simultaneously activatable by a control signal, which series connections are arranged in groups, the predecoded address bits of a corresponding predecoder being applied to the series connections of each group, all fuse elements but one of each group being uncoupled in the case of a defect in a memory column, the outputs of each group of series connections forming a wired logic function in conjunction with a relevant input of an active logic gate circuit associated with the redundancy address decoder, the latter gate circuit supplying the selection bit for the redundant memory column in the case of a defect in a memory column.

The expression redundant memory column in this context refers to a memory row as well to a memory column; the expression redundant memory space thus also covers one or more memory rows and/or columns.

As has already been stated, each of the groups of series connections in the redundancy address decoder is connected, via a wired logic function to an active gate circuit, that is to say a gate circuit comprising active elements. It is ensured that no "floating" outputs of the individual series connections are formed if no use is made of redundancy. It is to be noted that in said European Patent Application floating inputs of the gate circuit occur in the redundancy address decoder after the opening of the relevant fuse elements.

In accordance with the invention, each of the gating elements may be formed by a switchable inverter, the wired logic function may be an OR-function and the active logic gate circuit may be a NOR-gate. Alternatively, each of the gating elements may be formed by a p switching transistor and an n switching transistor connected in parallel, the wired logic function being an OR-function while the active logic gate circuit consists of a NAND-gate. In accordance with the invention the control signal for the gating elements may be derived from a control circuit which comprises a fuse element which is uncoupled when the selection bit for the redundant memory column must be output. In the case of a defect, all fuse elements but one of each group of series connections connected to a relevant precoder are then uncoupled, and also the fuse element in the control circuit and the fuse element for the addressing of the memory column in which the defect has occurred.

Furthermore, in accordance with the invention the described memory having redundant storage space is preferably accommodated in a single chip; evidently, however, it is also possible to distribute the described memory between a plurality of chips.

BRIEF DESCRIPTION OF THE DRAWINGS

The invention will be described in detail herein after with reference to the accompanying drawings, in which:

FIG. 3 shows an embodiment of a decoding channel of the main address decoder;

FIG. 4 shows an embodiment of the redundancy address decoder shown in FIG. 2;

FIG. 5 shows an embodiment of the control circuit for the redundancy address decoder;

FIG. 6 shows an embodiment of a switchable inverter included in the series connections;

In the various Figures corresponding elements are denoted by corresponding reference numerals. The invention is by no means restricted by the embodiments to be described with reference to the drawings; these embodiments serve merely for illustrating the invention.

DESCRIPTION OF THE PREFERRED EMBODIMENTS

Figure 1:
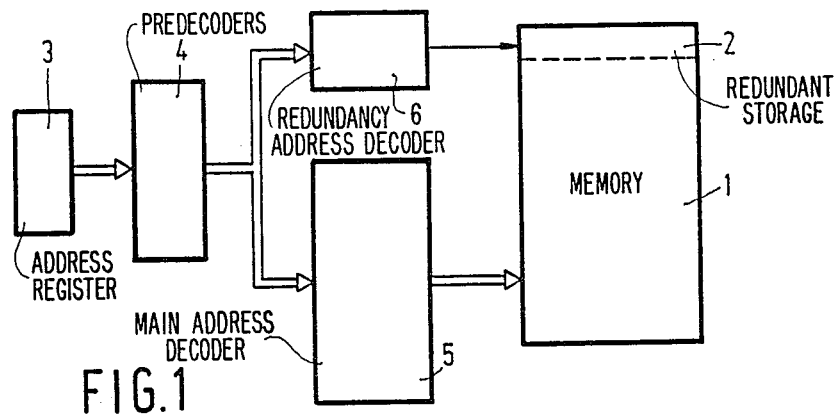
FIG. 1 shows the block diagram of a memory having redundant storage space in accordance with the invention.

In the block diagram shown in FIG. 1 the actual memory is denoted by the reference numeral 1; the associated redundant storage space is denoted by the reference numeral 2. The redundant storage space 2 may comprise one or more memory rows and/or columns. For the sake of simplicity the presence of only one redundant memory column is assumed; the expression memory column also covers a memory row.

The address decoder for the memory 1 comprises an address register 3, a number of predecoders which are denoted together by the reference numeral 4, a main address decoder 5 and a redundancy address decoder 6. The memory 1, 2 and the address decoder 3, 4, 5, 6, are accomodated in a single chip.

The predecoded address bits supplied by the predecoders are applied to the main address decoder 5 as well as to the redundancy address decoder 6. In the main address decoder 5 a selection bit for a memory column controlled thereby is derived from the predecoded address bits supplied. Thus, for an n bit address $2^n$ selection bits can be output via a corresponding number of leads. In the case of a defect in a memory column, only the selection bit for a substitute redundant memory column is derived in the redundancy address decoder.

The predecoders can be constructed in a variety of ways. In the case of 9-bit memory address, for example three predecoders can be used in order to form three groups of eight predecoded address bits. After decoding, each group presents a one-out-of-eight code. Alternatively, a bit can be used for dividing the memory into two submemories and four predecoders can be used for each sub-memory in order to obtain four groups of four predecoded address bits.

Figure 2:
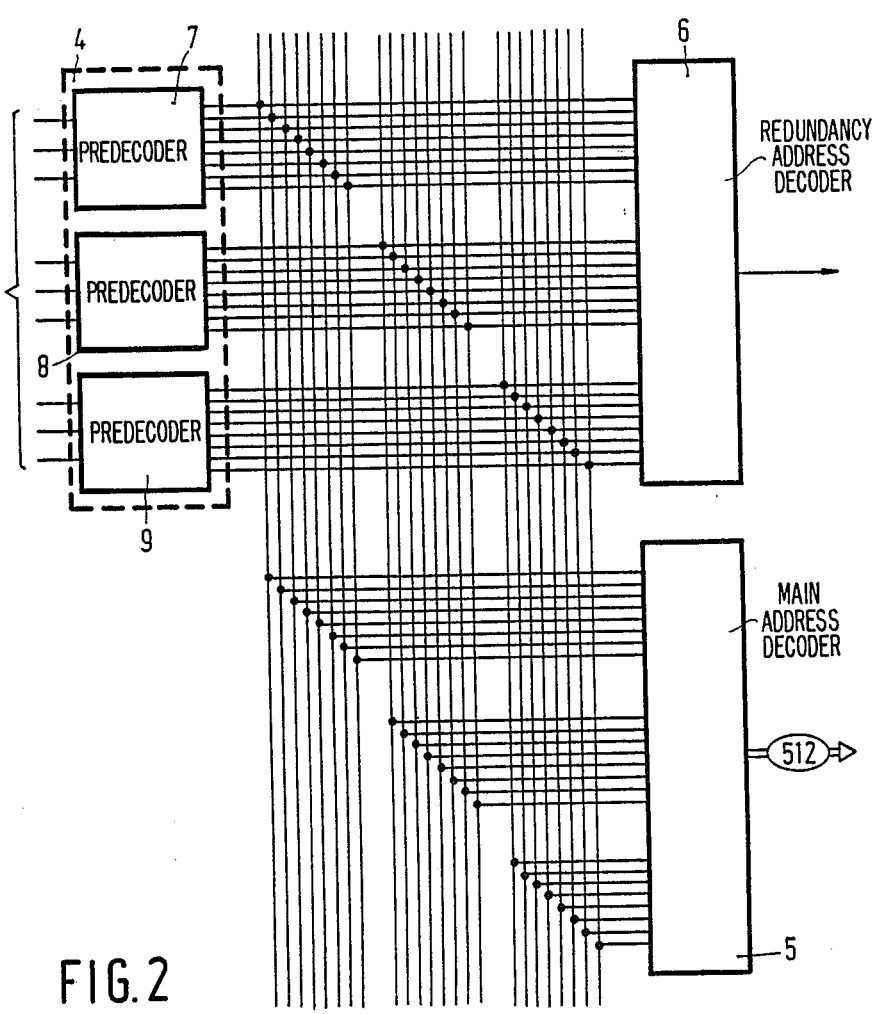
FIG. 2 shows an address decoder for the memory, based on a 9-bit address and three predecoders.

For FIG. 2 a 9-bit address is assumed; this address is applied in groups of three bits to three predecodes 7, 8 and 9. When the bits b0, b1 and b2 are applied to the predecoder 7, this predecoder will supply the predecoded address bits b0b1b2, b0b1b2, b0b1b2, b0b1b2, b0b1b2, b0b1b2, b0b1b2 and b0b1b2. Similarly, after reception of the bits b3, b4 and b5, and b6, b7, b8, each of the predecoders 8 and 9 supplies eight predecoded address bits. The three groups of predecoded address bits are applied, via a corresponding number of groups of eight predecoding lines, to the main address decoder 5 as well as to the redundancy address decoder 6. Each time one bit of each group of predecoded address bits supplied has the value "1"; the other predecoded address bits have the value "0".

The main address decoder 5 comprises 512 logic gate circuits, each of which comprises three inputs (corresponding to the number of predecoders) so that one of the predecoded address bits of the predecoders 7, 8 and 9 can applied to each of the inputs. Each gate circuit receives a different combination from the $8 \times 8 \times 8 = 512$ feasible combinations. FIG. 3 shows one of the 512 decoding chanels of the main address decoder 5. Therein, the logic gate circuit is formed by a NAND-gate 10, the decoding channel also comprising successively an inverter 11 and a fuse element 12. When no redundancy is used, the selection bit for the relevant memory column is output via this decoding channel. When redundancy is used, the fuse element 12 is opened when the relevant decoding channel is to be uncoupled from the relevant memory column. As a result of the use of predecoders, the gate depth of the decoding channels is limited. Moreover, the number of inputs of the gates need not be very large. An excessively large number would cause so-called fan-in problems.

FIG. 4 shows an embodiment of a redundancy address decoder 6 whereto three groups of eight predecoded address bits are applied. For each group of predecoded address bits applied, this embodiment comprises a corresponding number of series connections, each of which comprises a gating element 13 and a fuse element 14; in the embodiment shown in FIG. 4, the gating elements are formed by switchable inverters. Furthermore, per group connected to one precoder, the series connections are connected together in a wired-OR configuration 15 to an input of an active logic gate circuit 16 which consists of a NOR-gate in the embodiment shown in FIG. 4.

If no redundant memory column need be addressed, i.e. when the original memory is operating correctly, the control signal E for the switchable inverters is "0". The inverters are constructed so that in that case the output of the inverter is "1" if the input if "0" and high-ohmic if the input is "1". This property ensures that in that case the inputs of the NOR-gate 16 are always "1", because seven of the eight inverters per group receive a "0" on their input. The inverter whose input receives the "1" has a high-ohmic output, thus preventing a current from flowing due to a "1" impressed by the other inverters. The output of the NOR-gate is then "0", which means that no selection bit is supplied for the redundant memory column. In the case of a defect in the memory so that the redundant memory column should replace the memory column in which the defect has occured, E will be 1. Per group of eight series connections, furthermore, seven of the eight fuse elements are opened, so that only one fuse element remains active for each group of eight series connections. In the present situation, therefore, three series connection will remain active, that is to say those three which together determine the address of the defective memory column when the value "1" is applied to each of these three series connections, and the inputs of the NOR-gate 12 will all become "0", so that this gate outputs the selection bit for the redundant memory column.

The control signal E is derived in a control circuit which comprises a fuse element; FIG. 5 shows an embodiment of such a control circuit. The circuit comprises two transistors 17 and 18, an inverter 19 and a fuse element 20. When the fuse element 20 is not opened, E will always be 0 because the input of the invertor 19 is lowohmically connected to the supply voltage Vdd via the fuse element 20. When the fuse element is opened, the input of the inverter 19 is highohmically connected to the supply voltage. A brief pulse S on the input of the control circuit makes the input of the inverter 19 low and activates the memory circuit which is formed by the transistors 17, 18 and the gate of the transistor 18 connected to the output of the inverter 19. In this situation E remains 1, i.e. continuously due to the feed-back.

FIG. 6 shows an embodiment of the switchable inverters as included in the series connections of the redundancy address decoder shown in FIG. 4. The inverter comprises three transistors 21, 22 and 23. When the redundancy is not used, E=0 and the transistors 21 and 22 are turned off and the output of the inverter Puit=1 if the input of the inverter Pin=0 so that the transistor 23 is turned on, the output of the inverter Puit being high-ohmic if the input of the invertor Pin=1, so that the transistor is turned off. When the redundancy is used, E=1 and the transistor 21 is turned on. If the input of the invertor Pin=0 and hence the transistor 23 is turned on, Puit is again 1, while Puit will be 0 if Pin=1 and the transistor 23 is turned off but the transistor 22 is turned on.

When the redundancy is used, 3×7 fuse elements in the series connections of the redundancy address decoder are opened in the present embodiment, and also the fuse element in the control circuit and a fuse element which is included in the main address decoder for each memory column to be addressed in order to enable uncoupling of the defective memory column. Thus, in total 23 fuse elements are opened. The fuse elements used can be fuse elements customarily used in this kind of technique.

Viewed in depth, the redundancy address decoder successively utilizes the following components: an inverter, a fuse element and a gate circuit comprising three inputs. Comparison with the decoding channel of the main address decoder which is shown in FIG. 3 and which is successively composed of a gate circuit comprising three inputs, an inverter and a fuse element, reveals that the redundancy address decoder is optimally adapted to the main address decoder as far as the addressing time is concerned.

Figure 7:
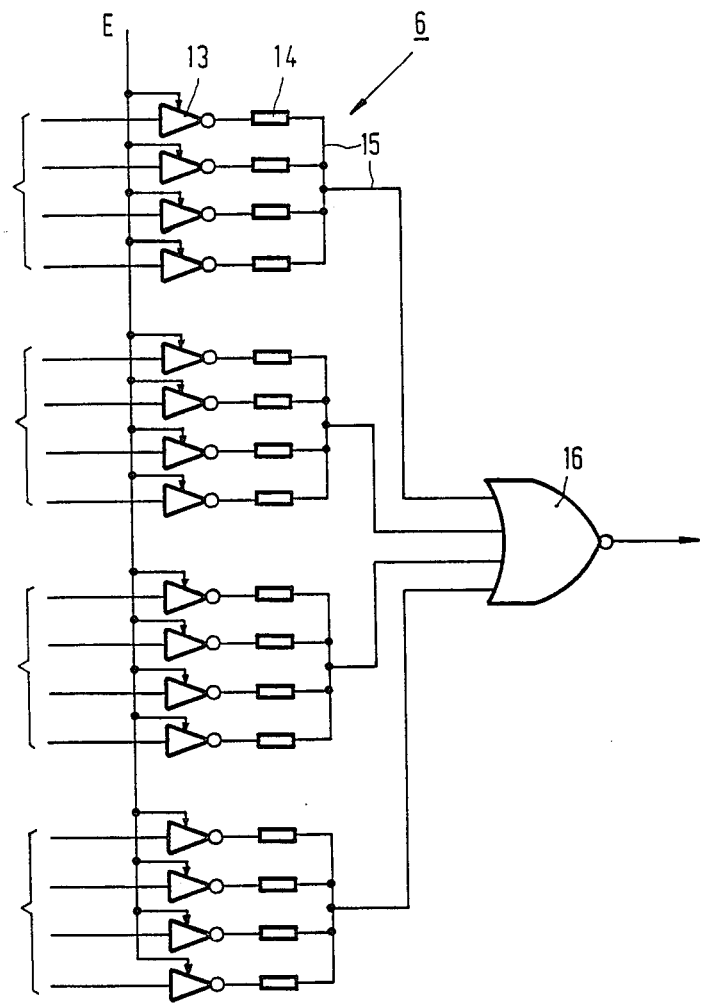
FIG. 7 shows a further embodiment of the redundancy address decoder, that is to say in the case of an 8-bit address and four predecoders.

FIG. 7 shows a redundancy address decoder of the same type as shown in FIG. 4, be it that it has be designed for a memory incorporating 8-bit addressing and four predecoders, each of which outputs four predecoded address bits. Thus, there are provided four groups of series connections which are group-wise connected to an input of the NOR-gate 16. The construction and operation of this redundancy address decoder are the same as that of the redundancy address decoder shown in FIG. 4. When the redundancy is used, 4×3+2=14 fuse elements must be opened. The main address decoder will comprise 256 decoding channels, each of which is composed of a four-input gate circuit, an inverter and a fuse element, so that correct adaptation of the redundancy address decoder to the main address decoder is again achieved in this embodiment.

Figure 8:
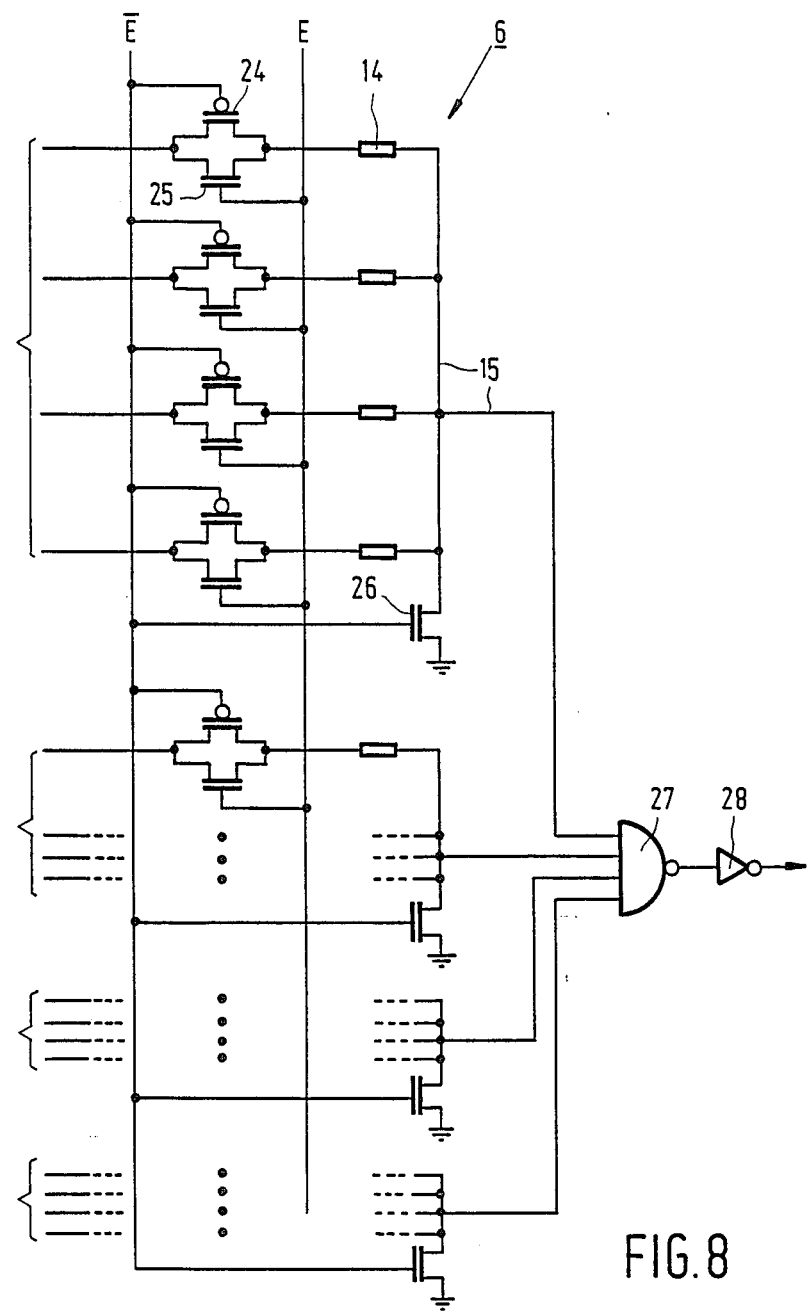
FIG. 8 shows an alternative for the redundancy address decoder shown in FIG. 7.

FIG. 8 shows a redundancy address decoder designed for a memory with 8-bit addressing and four predecoders, each of which outputs four predecoded address bits. Like in FIG. 7, there are again provided four groups of four series connections which are group-wise connected in a wired-OR configuration to an active logic gate circuit. The gating elements in the series connections are now formed by a parallel connection of a p switching transistor 24 and an n switching transistor 25, a common transistor 26 being provided for each group of series connections connected to the same input of the active logic gate circuit. The active logic gate circuit is formed by a NAND-gate 27, an inverter 28 being connected to the output thereof. The combination of a p switching transistor and an n switching transistor in parallel serves to ensure that a "0" as well as a "1" is conducted with the correct voltage level. This configuration is attractive notably for a static random access memory. A drawback consists in that two mutually inverse signals E and E must be supplied.

When no use is made of redundancy, E=0 and all transistors 24, 25 are turned off. In order to ensure in this situation that all inputs of the NAND-gate are "0", for each input of this gate there is provided a transistor 26 which is turned on by the control signal E=1. In this situation the output of the inverter 28 is "0" and no redundant memory column is addressed.

When redundancy is used, E=1 and all transistors 24, 25 are turned on. However, in this situation three of the four fuse elements 14 per group are opened again, so that in this embodiment only a total of four series connections remains active, that is to say those series connections which, when the value "1" is applied to each of these four series connections, together represent the address of the defective memory column; moreover, all inputs of the NAND-gate 27 will become "1", and hence also the output of the inverter 28, so that a selection bit for the redundant memory column is output. The transistors 26 are turned off in this situation.

Finally it is to be noted that, in the case of a plurality of redundant memory columns, a corresponding number of identically constructed redundancy address decoders should be provided. In as far as is necessary, each of these redundancy address decoders can be programmed for its own defective memory column. If a redundant column appears to be defective itself after having been switched on, it can be deactivated again and another redundant column can be programmed so as to take its place. The described redundancy can not only be provided in one direction, but also in both (row and column) directions.

What is claimed is:

1. A row-and-column organized memory having standard memory columns and at least one redundant memory column, and an addressing structure for selectively addressing a single one of said memory columns, said addressing structure comprising:
   input means for inputting a set of address bits;
   a first plurality of predecoders fed by said input means, each predecoder receiving an exclusive subset of said set of address bits and decoding the subset received to a one-out-of-n-code on n respective outputs thereof;
   a main decoder comprising a second plurality of logic circuits each fed by all predecoders of said first plurality for each receiving an exclusive combination among said outputs for responding to one particular content of said address bits, each such logic circuit feeding an associated standard memory column via an interconnection that comprises a fuse element for disabling the associated interconnection by selectively blowing the fuse element; and
   a redundancy decoder having for each redundant memory column an associated redundancy structure, each redundancy structure having a third plurality, equal to said first plurality, of groups of inputs, within any group each input being one-to-one connected to one said output of the predecoder associated with the group in question, each such input comprising a second fuse element for disabling the associated input by selectively blowing the second fuse element, and also a gating element for disabling the associated input under control of a control signal on a control signal input, each redundancy structure having all of its control signal inputs joined for receiving a global control signal, all inputs of each group feeding a wired logic structure associated with said particular group, and an active logic gate having, for each of said third plurality of groups, a separate further input fed by an exclusive one of said wired logic structures, said active logic gate feeding an associated redundant memory column.

2. A memory as claimed in claim 1, characterized in that each of the gating elements is formed by a switchable inverter, the wired logic function being an OR-function and the active logic gate circuit comprising a NOR-gate.

3. A memory as claimed in claim 1, characterized in that each of the gating elements is formed by a switchable, non-inverting gating element, the wired logic function being an OR-function and the active logic gate circuit comprising a NAND-gate.

4. A memory as claimed in claim 3, characterized in that the non-inverting gating element is formed by a parallel connection of a p switching transistor and an n switching transistor whose gates are connected to respective inputs for mutually inverse control signals.

5. A memory as claimed in claims 1, 2, 3 or 4, characterized in that in order to form a said control signal there is provided a latch circuit which comprises an input for an activation signal (S), a feedback circuit (17, 18, 19) which receives said activation signal in order to change over from a non-active state to a permanently active state, and a fuse element which is connected to a voltage source in order to prevent, by way of short-circuiting, the change over to be activated by the activation signal, said fuse element, after opening, no longer forming said short-circuit so that said control signal then appears on an output of the feedback circuit.

6. An integrated circuit comprising a memory having redundant storage space as claimed in claims 1, 2, 3 or 4.